(12) United States Patent
Mahler et al.

(10) Patent No.: US 8,507,080 B2
(45) Date of Patent: *Aug. 13, 2013

(54) THERMOPLASTIC-THERMOSETTING COMPOSITE AND METHOD FOR BONDING A THERMOPLASTIC MATERIAL TO A THERMOSETTING MATERIAL

(75) Inventors: Joachim Mahler, Regensburg (DE); Alfred Haimerl, Sinzing (DE); Wolfgang Schober, Amberg (DE); Michael Bauer, Nittendorf (DE); Angela Kessler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 788 days.

This patent is subject to a terminal disclaimer.

(21) Appl. No.: 11/915,037

(22) PCT Filed: Apr. 26, 2006

(86) PCT No.: PCT/DE2006/000724
§ 371 (c)(1),
(2), (4) Date: Jul. 8, 2008

(87) PCT Pub. No.: WO2006/128413
PCT Pub. Date: Dec. 7, 2006

(65) Prior Publication Data
US 2009/0280314 A1 Nov. 12, 2009

(30) Foreign Application Priority Data
May 30, 2005 (DE) .................... 10 2005 025 083

(51) Int. Cl.
*B23B 5/14* (2006.01)

(52) U.S. Cl.
USPC ............... 428/310.5; 428/312.8; 257/783; 257/790; 438/123; 438/124

(58) Field of Classification Search
USPC .................. 428/310.5, 312.2, 312.8
See application file for complete search history.

(56) References Cited

U.S. PATENT DOCUMENTS
4,359,493 A    11/1982    Henery
4,906,493 A    3/1990     Laine
(Continued)

FOREIGN PATENT DOCUMENTS
DE    19911477     9/2000
EP    1365458      11/2003
WO    0147704      7/2001
WO    2006034682   4/2006

OTHER PUBLICATIONS

W.A. Bryant, The Fundamentals of Chemical Vapour Deposition, 12 Journal of Materials Science 1285-1306 (1977).*
Machine Translation of Kessler, WO-2006/034682 (2012).*

(Continued)

*Primary Examiner* — Gerard Higgins
*Assistant Examiner* — Scott R Walshon
(74) *Attorney, Agent, or Firm* — Dicke, Billig & Czaja, PLLC

(57) ABSTRACT

Composite with a first part composed of a thermoset material and with a second part composed of a thermoplastic material, and with an adhesion-promoter layer located between these, where the first part has been bonded by way of the adhesion-promoter layer to the second part, and where the adhesion-promoter layer comprises pyrolytically deposited semiconductor oxides and/or pyrolytically deposited metal oxides.

14 Claims, 2 Drawing Sheets

(56) References Cited

U.S. PATENT DOCUMENTS

| | | | |
|---|---|---|---|
| 5,096,526 A * | 3/1992 | Engwall | 156/197 |
| 5,153,986 A | 10/1992 | Brauer et al. | |
| 5,730,922 A * | 3/1998 | Babb et al. | 264/258 |
| 5,753,322 A * | 5/1998 | Yamaguchi et al. | 428/14 |
| 5,895,723 A | 4/1999 | Utz | |
| 5,946,556 A * | 8/1999 | Hashizume | 438/126 |
| 6,150,010 A * | 11/2000 | Eissa | 428/201 |
| 6,228,688 B1 * | 5/2001 | Ohta et al. | 438/127 |
| 6,259,157 B1 * | 7/2001 | Sakamoto et al. | 257/723 |
| 6,319,624 B1 * | 11/2001 | Watanabe et al. | 428/329 |
| 6,605,357 B1 * | 8/2003 | Miyake et al. | 428/420 |
| 7,013,965 B2 * | 3/2006 | Zhong et al. | 165/185 |
| 2001/0014420 A1 * | 8/2001 | Takeuchi et al. | 429/209 |
| 2003/0013235 A1 * | 1/2003 | Featherby et al. | 438/127 |
| 2004/0194691 A1 * | 10/2004 | George et al. | 117/84 |
| 2004/0216494 A1 * | 11/2004 | Kurotani | 65/531 |
| 2004/0247948 A1 | 12/2004 | Behle et al. | |
| 2005/0051763 A1 * | 3/2005 | Affinito et al. | 257/3 |
| 2007/0205518 A1 | 9/2007 | Bauer et al. | |

OTHER PUBLICATIONS

Choy, K.L., ed. "Innovative Processing of Films and Nanocrylstalline Powders", Imperial College Press (2002) pp. 147-164.*

Oxford English Dictionary definition of "compact", available at http://www.oed.com/view/Entry/37368 (accessed Jan. 8, 2013).*

* cited by examiner

THERMOPLASTIC-THERMOSETTING COMPOSITE AND METHOD FOR BONDING A THERMOPLASTIC MATERIAL TO A THERMOSETTING MATERIAL

The present invention relates to a thermoplastic-thermoset composite, and also to a process for the bonding of a thermoplastic material to a thermoset material.

There is often a requirement to use thermoplastic materials, such as polyethylene terephthalate or polyphenylene sulfide, for injection or potting processes to surround thermoset components, in particular semiconductor components which have a casing composed of a thermoset material. This arises by way of example when a semiconductor component is to be provided with a retainer composed of a thermoplastic material, in order to render the component installable.

A general problem here, and when thermoset materials are bonded to or combined with thermoplastic materials, is provision of good adhesion between the two different materials. One possibility is deformation of the thermoset surface, in order to create greater adhesion between a thermoset part and a thermoplastic part to be applied thereto. However, this is in particular not possible in the case of casings of semiconductor components.

Two-component injection molding is a method that can be used to produce thermoset-thermoplastic composites, but this is another example of a method that cannot be used here, because subsequent application of components to the finished semiconductor component is involved.

Adhesion between a thermoset and a thermoplastic can be produced via welding of the components at their interfaces (interdiffusion of the molecular chains). This welding can be carried out, for example, with contact of the heated thermoplastic material or of the thermoplastic melt on the cooled thermoset material. If a thermoplastic material is then applied conventionally to a thermoset material, there is the general problem that adhesion is inadequate and delamination often occurs.

It is therefore an object of the present invention to provide a process for the bonding of a thermoplastic material to a thermoset material, and also to provide a thermoplastic-thermoset composite, and thus to provide improved adhesion between the two materials, with avoidance of subsequent separation.

This object is achieved by the subject matters of the independent claims. The dependent claims give advantageous embodiments of the invention.

The invention provides a composite with a first part composed of a thermoset material, with a second part composed of a thermoplastic material, and with an adhesion-promoter layer located between these. The first part has been bonded by way of the adhesion-promoter layer to the second part. The adhesion-promoter layer comprises pyrolytically deposited semiconductor oxides and/or pyrolytically deposited metal oxides.

The inventive adhesion-promoter layer can give a secure bond between the materials when the thermoplastic material and the thermoset material are heated. By virtue of the adhesion-promoter layer provided between the thermoplastic material and the thermoset material, a stable durable bond is created between the thermo-plastic and the thermoset.

By virtue of the pyrolytic deposition process, the adhesion-promoter layer comprises semiconductor oxides and/or metal oxides of a reactive compound composed of oxygen and of organometallic molecules. Organometallic molecules in this context are organic molecules which comprise semiconductor elements and/or metal elements in the form of free radicals and/or in the form of central atom. In this context, the organometallic molecules also include silanes, where these comprise appropriate tetravalent semiconductor atoms, such as silicon, instead of the central carbon atom of organic compounds.

Layer formation itself takes place by virtue of the respective selected deposition conditions on the surfaces of the thermoset or of the thermoplastic. Disposal of the reaction products of the pyrolytic deposition process, the amounts of which produced by the process are exceptionally small, can moreover be achieved by environmentally compatible methods.

Another advantage of the pyrolytic deposition process is that the surfaces can be coated without using high temperatures, e.g. a temperature greatly above 100° C. This is particularly advantageous if the intention is to coat the surfaces of a semiconductor component casing. There is no resultant impairment of the semiconductor chip of the finished semiconductor component. Furthermore, the morphology of the adhesion-promoter layer can be adjusted via the setting of the deposition conditions. The roughness and porosity of the layer surface can be adjusted in such a way as to permit achievement of improved anchoring between the plastics material of the two parts by way of the adhesion-promoter layer.

Advantageous thermoplastic materials are liquid-crystalline polymer (LCP), polyethylene terephthalate (PET), polyether sulfone (PES), polyphenylene sulfide (PPS), polyether ether ketone (PEEK), or polysulfone (PSU).

It is particularly preferable that the thermoplastic material is a high-performance thermoplastic. Certain engineering thermoplastics can be used, an example being PET or polycarbonate (PC).

Advantageous thermoset materials are moreover synthetic resins, in particular epoxy resin or silicone resin.

In one preferred embodiment, the adhesion-promoter layer comprises semiconductor oxides and/or metal oxides of the elements Al, B, Ce, Co, Cr, Ge, Hf, In, Mn, Mo, Nb, Nd, Ni, Pb, Pr, Pt, Rb, Re, Rh, Ru, S, Sb, Sc, Si, Sm, Sn, Sr, Ta, Te, Ti, Tl, Tm, U, V, W, Yb, Zr, or Zn. An advantage of these semiconductor elements and/or metal elements is that there are known organometallic compounds which derive from these elements and which are suitable for the formation of an adhesion-promoter layer with microporous morphology. By mixing different organometallic starting materials of these semiconductor elements and/or metal elements here, it is possible advantageously to achieve not only the adhesion-promoting properties of the resultant layers but also a color difference between the adhesion-promoter layer and the surface of the semiconductor components. To this end, mixtures of different organometallic compounds of these elements listed above can be advantageously formed by a joint combustion process in a pyrolysis system or flame pyrolysis system.

The resultant adhesion-promoter layer preferably comprises a semiconductor oxide and/or metal oxide from the group of $Al_2O_3$, $B_2O_3$, $Ce_2O_3$, $CoO$, $Co_2O_3$, $GeO_2$, $HfO_2$, $In_2O_3$, $Mn_2O_3$, $Mn_3O_4$, $MoO_2$, $Mo_2O_5$, $Nb_2O_3$, $NbO_2$, $Nd_2O_3$, $Ni_2O_3$, $NiO$, $PbO$, $Pr_2O_3$, $PrO_2$, $PtO$, $Pt_3O_4$, $Rb_2O$, $ReO_2$, $ReO_3$, $RhO_2$, $Rh_2O_3$, $RuO_2$, $SO_3$, $Sb_2O_4$, $Sb_4O_6$, $Sc_2O_3$, $SiO_2$, $Sm_2O_3$, $SnO$, $SnO_2$, $SrO$, $Te_2O_5$, $TeO_2$, $TeO_3$, $TiO$, $TiO_2$, $Ti_2O_3$, $Tl_2O_3$, $Tm_2O_3$, $UO_2$, $U_3O_8$, $UO_3$, $VO$, $V_2O_3$, $V_2O_4$, $V_2O_5$, $WO_2$, $WO_3$, $Yb_2O_3$, $ZrO_2$, or $ZnO$, or a mixture of these. An advantage of these oxides is that they can be pyrolytically deposited in the form of finely divided oxides. These oxides also have sufficient thermal and mechanical stability to produce a stable and dependable adhesion-promoter layer. The result is therefore creation of a dependable bond between the thermoset and the thermoplastic.

In another embodiment of the invention, the adhesion-promoter layer comprises silicate compounds. These silicate compounds have the advantage of forming a chemical bond with the plastic, the silicates having the capability of forming hydrolysis-resistant chemical bonds by way of Si—C bonding. However, the interaction between silicates and plastics materials is of considerable complexity, and water molecules can effect a type of flexible bonding by forming oxyhydrate layers. Another factor here is that coupling of silicates to plastics has been proven successful in industry over many years hitherto.

Adhesion-improving effects are likewise to be expected from the other oxides listed above. However, the level of these adhesion-improving effects is markedly below that of hydrolyzable groups which form a silicatic skeleton by way of formation and condensation of Si—OH groups. The Si—OH groups here condense with one another and with OH groups of the carrier substrate. An advantage of silicate compounds is therefore that they can form stable bonds not only with plastics casing materials but also between the thermoset and the surrounding thermoplastic. The microporous surface structure of the inventive adhesion-promoter layer moreover enlarges the reaction area, and microretentive adhesion elements are introduced into the interfaces.

Another advantage of this type of silicate layer is that silicates can form chemical bonds with a wide variety of elements and materials, and application of the silicate therefore also permits formation of stable silicate structures in the interfaces.

The average thickness D of the adhesion-promoter layer is in the range $5\ nm \leq D \leq 300\ nm$, preferably in the range $5\ nm \leq D \leq 40\ nm$.

This permits secure bonding between the thermoset and the thermoplastic, without any impairment due to heating of the parts during the deposition process.

The adhesion-promoter layer is preferably porous, thus increasing the surface area between the parts and providing improved mechanical anchoring between the thermoset and the thermoplastic. In another embodiment of the invention, the porosity of the adhesion-promoter layer gradually increases from a pore-free coating on the surface of one part to a microporous morphology in the region of transition to a second part. Intermeshing between the thermoplastic and the thermoset is increased by virtue of the gradual increase in porosity from an initially compact adhesion-promoter layer to a microporous morphology of the surface.

In one preferred embodiment, the thermoset material forms a casing of a semiconductor component, and the thermoplastic material forms a casing retainer on the casing of the semiconductor module, where the casing and the casing holder have been securely bonded to one another via the adhesion-promoter layer arranged between them. The inventive adhesion-promoter layer comprises pyrolytically deposited semiconductor oxides and/or pyrolytically deposited metal oxides. Use of the inventive composite is advantageous in components which are intended for use in operating conditions subject to high load. Modules for automobiles are an example of these applications.

A process for the production of a composite comprises the following steps. A first part which comprises a surface composed of a thermoset material, and a second part which comprises a surface composed of a thermo-plastic material are provided. The invention deposits an adhesion-promoter layer by means of a pyrolytic deposition process on the surface of the first part and/or the surface of the second part. The adhesion-promoter layer comprises pyrolytically deposited semiconductor oxides and/or pyrolytically deposited metal oxides. The first part and the second part are joined, in such a way that the adhesion-promoter layer has been arranged between the first part and the second part. The thermoplastic material and the thermoset material are heated, in order to generate a bond between the thermoplastic material and the thermoset material.

The coating process can produce a microporous morphology of the semiconductor promoter layer, which comprises semiconductor oxides and/or metal oxides of a reactive compound composed of oxygen and of organo-metallic molecules. The average application thickness D of this adhesion-promoter layer is preferably in the range $5\ nm \leq D \leq 300\ nm$. In this coating process, semiconductor oxides or metal oxides are deposited on the surfaces of the thermoset and, respectively, thermoplastics. It is typically only in the immediate vicinity of the surfaces to be coated that these semiconductor oxides and, respectively, metal oxides form a compact layer whose thickness is a few nanometers and which simultaneously protects the surfaces from erosion and corrosion. As the coating becomes thicker, the pore density increases, thus giving a microporous morphology which can develop high adhesion to the second part. The coating procedure itself can be accelerated via input of butane or propane with oxygen in a reaction space to which the organometallic molecules are introduced.

The coating process preferably involves a flame pyrolysis deposition process. An advantage of flame pyrolysis deposition is that the above-mentioned reaction products are produced in a combustion gas stream from which semiconductor oxides and/or metal oxides of the organometallic compound are deposited on the surfaces of the substrate. In principle, this pyrolytic deposition process can take place independently of the material of the surfaces. Flame pyrolysis is therefore a simple and universally applicable process.

It is therefore possible to coat the thermoset or the thermoplastic or both of the parts to be bonded. If the casing of a semiconductor component is a thermoset, it is advantageous to coat the semiconductor component. The component coated with an adhesion-promoter layer can be embedded into a thermoplastic in a further separate production process. This process can be carried out directly at the customer's premises, rather than at the premises of the component producer. It is also possible to use the inventive adhesion-promoter layer to coat the surface of a thermoplastic retainer. An advantage of this is that uncoated semiconductor components can be used.

In the flame pyrolysis process, an organometallic compound of the abovementioned elements is decomposed in a gas/air flame. The gas used for the gas/air flame is preferably methane, butane or propane. A $MeO_x$ layer is deposited in an optimized region of the flame onto the surfaces of the ready-mounted semiconductor components. Me here means the above-mentioned semiconductor elements and/or the above-mentioned metal elements.

The average layer thickness D deposited here is in the range $5\ nm \leq D \leq 300\ nm$, and the average layer thickness D is preferably in the range $5\ nm \leq D \leq 40\ nm$. Since the layer to be applied is only very thin, materials costs are also extremely low. The extent of heating of the parts here during the coating process can be kept below 100° C., in particular in the case of the preferred variant. This is particularly advantageous in the coating of semiconductor component casings.

Another advantage of the flame pyrolysis process is that the temperature of the surfaces of the semi-conductor components does not increase substantially and can, under suitable process conditions, preferably be kept below 100° C., in particular because the time for which the surfaces come into contact with the flame of the coating system is only seconds.

The inventive process can achieve a marked improvement in the adhesion between thermosets and thermoplastics.

The organometallic molecule used is preferably a tetra-methylsilane or a derivative of tetramethylsilane, preferably tetraethylsilane, the molecular formula of which is $Si(C_2H_5)_4$. If propane, with molecular formula $C_3H_8$, and oxygen $O_2$ are added, silicates $SiO_x$ are deposited on the surfaces, while the volatile reaction products that form, and escape, are carbon dioxide and water.

In one preferred embodiment of the process, for the flame pyrolysis coating process, an organometallic compound of a semiconductor element or of a metal element, and oxygen, or an oxygen-containing compound, are introduced with a combustion gas into a coating system, whereupon semiconductor oxides or metal oxides are deposited on all sides on the free surfaces of the substrate, these being reaction products of the input compounds. For deposition on all sides it is preferable to use a ring burner which generates a flame ring through which the substrate is conducted.

In another preferred method for the process, prior to the coating of the surface with adhesion promoter, surface regions to be kept free are coated with a protective layer. After the coating process, this protective layer can advantageously be swelled so that it can be removed, with its covering of adhesion-promoter layer, at the surface regions to be kept free.

In another preferred method for the process, the surface regions to be kept free are in turn uncovered only after the coating of the surfaces with adhesion promoter. In this process, prior to the uncovering process, the surface regions on which the adhesion promoter is intended to remain can be protected. The uncovering process can take place by means of laser ablation or by means of plasma etching methods.

The invention also provides a semiconductor component with a semiconductor chip and with a plastics casing, where the plastics casing comprises a thermoset and an adhesion-promoter layer as in any of the embodiments on at least the surface of the thermoset.

An advantage of this embodiment is that a semiconductor component is provided with a surface which adheres well to a thermoplastic. This is advantageous if the intention is, at a customer's premises, to incorporate the semiconductor component in a thermoplastic casing retainer, or to embed it in a thermoplastic material with other components. This can be desirable if the component has exposure to additional mechanical loads or environmental stresses during operation. Improved adhesion and a dependable bond are therefore provided between the thermoset casing and the thermoplastic encapsulation.

The semiconductor casing and the casing retainer are advantageously bonded to one another, thus rendering the semiconductor component installable.

In another preferred embodiment, the bonding process between the thermoset and the thermoplastic takes the form of an encapsulation process at temperatures above 260° C., where the temperature of 260° C. also corresponds to the maximum soldering temperature peak for high-performance semiconductor casings.

In another preferred embodiment, the encapsulation process encompasses the encapsulation, by a thermoplastic material, of a semiconductor component potted in a thermoset material.

The invention is described in more detail using the drawings.

Figure 1:
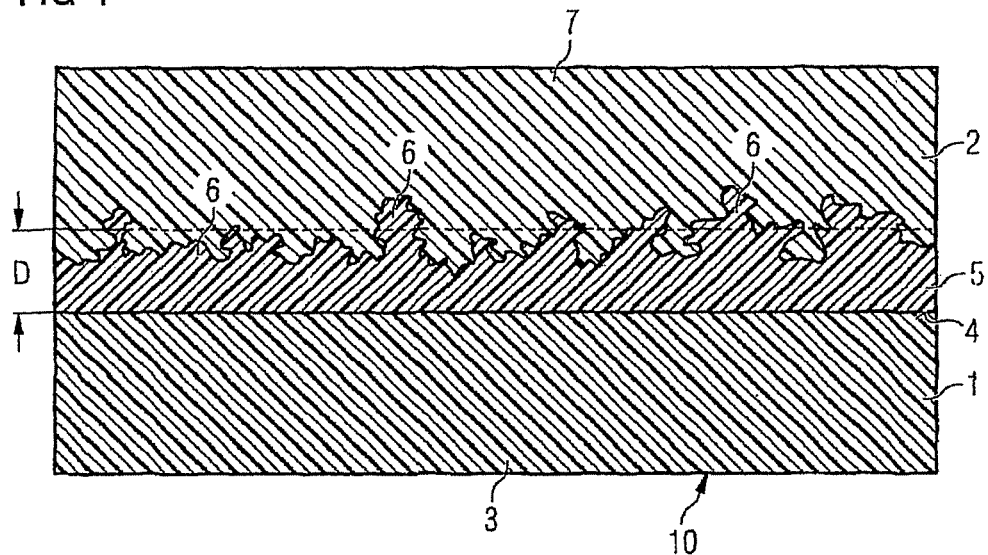
FIG. 1 is a diagram of a cross section through a composite involving a thermoplastic and a thermoset.

FIG. 1 is a diagram of a cross section of a composite 10. The composite has a first part 1 composed of a thermoset material 3 and has a second part 2 composed of a thermoplastic material 7. The first part 1 has been bonded by way of an adhesion-promoter layer 5 to the second part 2. The adhesion-promoter layer 5 comprises silicates deposited by flame pyrolysis. In this embodiment, the first part 1 is a thermoset casing of a semiconductor component 20, which can be seen in FIG. 3.

The average thickness D of the adhesion-promoter layer 5 is in the range from 5 to 300 nm, and in the inventive embodiment shown it has a preferred thickness which varies in the range from 5 to 40 nm. The lower 5 to 10 nm of the adhesion-promoter layer 5 cover the surface 4 of the thermoset casing 1 of the semi-conductor component 20, with fully compact morphology.

Above this region in the range from 5 to 10 nm, the porosity of the adhesion-promoter layer 5 increases, and in the uppermost region it has microporous morphology 6. This microporous morphology 6 of the adhesion-promoter layer 5 increases the level of inter-meshing with the thermoplastic material 7. Furthermore, this microporous morphology 6 of the adhesion-promoter layer 5 provides mechanical anchoring between the thermoset casing material 3 and the thermoplastic material 7.

Figure 2:
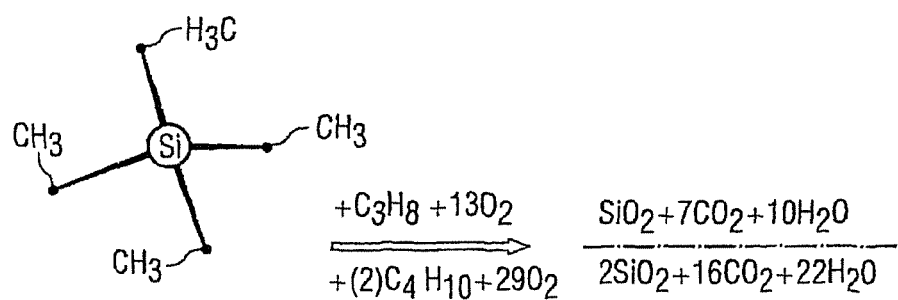
FIG. 2 shows a system of reactions for flame pyrolysis coating of surfaces with an adhesion-promoter layer which comprises silicates.

FIG. 2 shows a system of reactions for flame pyrolysis coating of surfaces with an adhesion-promoter layer which comprises silicates. In order to form the silicates in the form of $SiO_x$, an organometallic compound in the form of a tetramethylsilane and derivatives of tetramethylsilane, preferably tetraethylsilane, whose molecular formula is $Si(C_2H_5)_4$, is introduced into a flame coating system. This tetraethylsilane has, as central Me atom, a silicon atom Si, which has four surrounding organic ethyl moieties —$C_2H_5$, as indicated on the left-hand side of FIG. 2.

In the coating system, the tetraethylsilane $Si(C_2H_5)_4$ is, for example, mixed with a propane gas of molecular formula $C_3H_8$ and with oxygen 13 $O_2$ and subjected to combustion, whereupon volatile carbon dioxide 7 $CO_2$ and water 10 $H_2O$ are produced as reaction products, and $SiO_x$ silicates, preferably silicon dioxide $SiO_2$, are deposited on the surface of the parts to be coated, for example of a thermoset or of a thermoplastic. FIG. 2 shows another possible reaction, separated by a broken line, in which butane with molecular formula $C_4H_{10}$ is introduced instead of propane with molecular formula $C_3H_8$. In this case, two tetraethylsilane molecules can react with two butane molecules and twenty-nine $O_2$ molecules to give $SiO_x$ silicate, which is deposited, and volatile carbon dioxide 16 $CO_2$, and volatile water 22 $H_2O$ in the butane flame. It is also possible to use methane with molecular formula $CH_4$ instead of butane $C_4H_{10}$ for the flame pyrolysis process.

Using this type of flame pyrolysis process, an $SiO_x$ layer is deposited as adhesion-promoter layer on the surfaces of the thermoset casing of a semiconductor component. The average layer thickness needed is only from 5 to 40 nm, and up to 300 nm can be deposited if necessary. A periodic method for the coating process can be used to reduce the extent of heating of the semiconductor component down to less than 100° C.

The effective flame-application time is in the region of seconds. This type of flame coating process also gives simultaneous surface cleaning and simultaneous surface activation, and the silicates deposited therefore bond intimately to the plastics surface, in this case a thermoset surface. Disposal of the reaction products liberated, e.g. amorphous silicon dioxide, and also the volatile water and the volatile carbon dioxide, can be achieved very substantially in environmentally compatible fashion, by passing the volatile components into water and collecting or precipitating the excess silicon dioxide.

Figure 3:
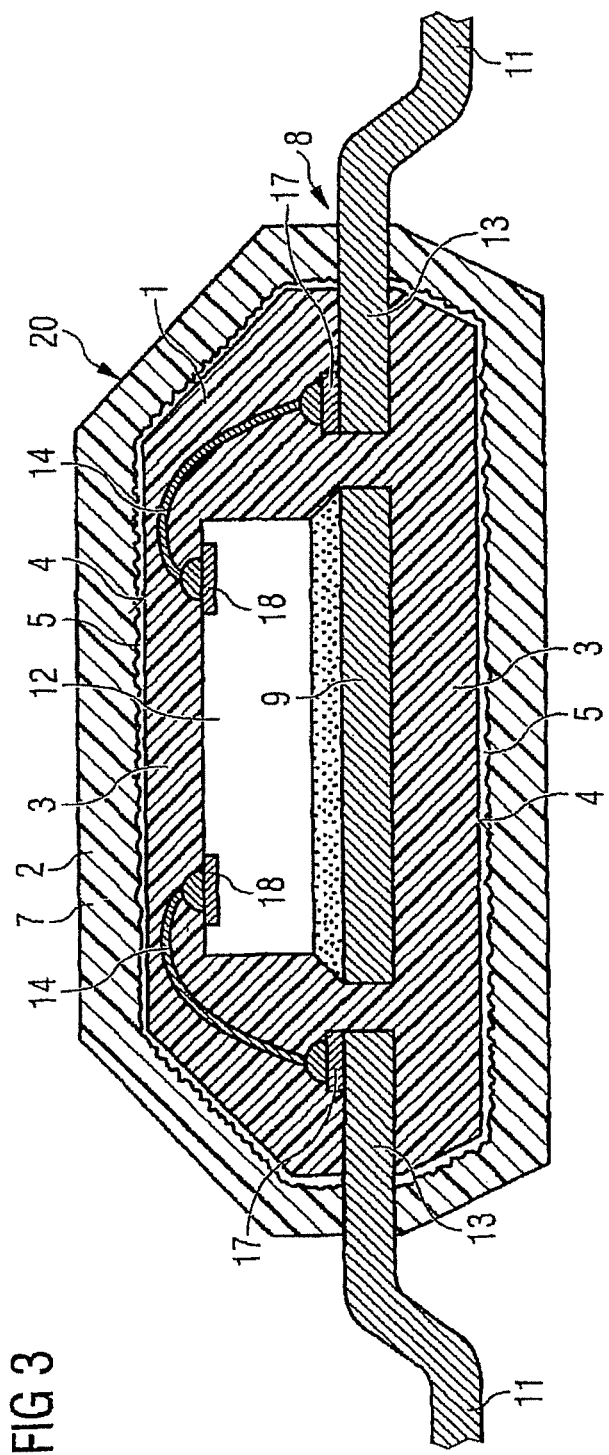
FIG. 3 is a diagram of a cross section through a semiconductor component whose casing comprises an adhesion-promoter layer.

FIG. 3 is a diagram of a cross section through a semiconductor component 20 with a semiconductor chip 12 and with a flat conductor frame 8, which comprises a chip island 9 and flat conductor 13. The reverse side of the semiconductor chip 12 has been mounted on the chip island 9. The contact areas 18 of the semiconductor chip 12 have been connected electrically by way of bonding wires 14 to the contacts 17 of the flat conductors 13. The semiconductor chip 12, bonding wires 14, the chip island 9, and the inner parts of the flat conductors 13 have been embedded in a thermoset material 3. The outer parts 11 of the flat conductors 13 extend out from the thermoset material 3. The outer surface 4 of the thermoset material 3 forms the outer surface of the semiconductor component 20.

The outer surfaces 4 of the casing 1 of the semi-conductor component 20 have been coated with an adhesion-promoter layer 5. In this semiconductor component 20, all of the surfaces 4 have been provided with a flame-pyrolysis adhesion-promoter layer 5 in order to improve surface adhesion between the surfaces 4 of the casing 1 of the semiconductor component 20 and a thermoplastic material 7. The pyrolytic layer 5 deposited comprises silicates of a reactive compound composed of oxygen and of organometallic molecules, and has porosity 6 and roughness which improves anchoring between the thermoset casing material 3 and the thermoplastic encapsulation material 7.

By virtue of the adhesion-promoter layer 5 on the surfaces 4 of the thermoset casing 1, a marked improvement can be achieved in adhesion between the thermoset 3 and a thermoplastic 7. To this end, an organometallic compound or an organosilicon compound is fed into a flame, and the resultant silicate or metal oxide is deposited from the gas phase on the surfaces 4 of the semiconductor components 20.

This uniform coating process can take place in a flame tube or by means of passage of the finished mounted semiconductor components 20 through a flame ring, where the residence time in the region of the flame tube or of the flame ring is only a few seconds. In the case of a semiconductor component 20 as shown in FIG. 3, the outer flat conductors 11 not intended to be provided with an adhesion-promoter layer are protected via application of a protective layer, prior to a coating process in the flame tube or in the ring burner.

The semiconductor component 20 coated with the adhesion-promoter layer 5 can, after it has been mounted on a printed circuit board, be dependably embedded into a thermoplastic 7, in order that the component can be better protected from mechanical loads and from damaging environmental conditions. The process of mounting and of embedding in a thermoplastic can be carried out at the customer's premises, in order to create an element for subsequent incorporation.

key
1 Semiconductor component casing
2 Casing retainer
3 Thermoset material
4 Surface
5 Adhesion-promoter layer
6 Porosity
7 Thermoplastic material
8 Flat conductor frame
9 Chip island
10 Composite
11 Outer flat conductor
12 Semiconductor chip
13 Flat conductor
14 Bonding wire
15
16
17 Contact area
18 Chip contact area
19
20 Semiconductor component

What is claimed is:

1. A semiconductor component, comprising:
a semiconductor chip having a first side and a second side, the second side having contact areas thereon;
a chip island having the first side of the semiconductor chip mounted hereon;
a flat conductor including inner and outer portions, the inner portions having contacts;
bonding wires electrically connecting the contact areas on the second side of the semiconductor chip to the contacts of the flat conductor;
a first part including a thermoset material embedding the semiconductor chip, the chip island, the bonding wires, and the inner portion of the flat conductor to form a semiconductor component casing;
a second part including a thermoplastic material embedding the first part to form a casing retainer on the semiconductor component casing; and
a porous adhesion-promoter layer located between the first and second parts, wherein the first part is bonded by the adhesion-promoter layer to the second part, and wherein the adhesion-promoter layer includes at least one of pyrolytically deposited semiconductor oxides and/or pyrolytically deposited metal oxides such that a first portion of the adhesion-promoter layer covers the first part with a pore-free fully compact morphology and the porosity of the adhesion-promoter layer gradually increases such that a second portion of the adhesion-promoter layer adjacent the second part has microporous morphology, and wherein the average thickness D of the adhesion-promoter layer is in the range $5\ \text{nm} \leq D \leq 40\ \text{nm}$.

2. The component of claim 1, wherein the thermoplastic material is selected from the group consisting of a liquid-crystalline polymer (LCP), polyethylene terephthalate (PET), polyether sulfone (PES), polyphenylene sulfide (PPS), polyether ether ketone (PEEK), and polysulfone (PSU).

3. The component of claim 1, wherein the thermoplastic material is a high-performance thermoplastic or an engineering thermoplastic.

4. The component of claim 1, wherein the thermoset material is a synthetic resin.

5. The component of claim 1, wherein the adhesion-promoter layer comprises semiconductor oxides and/or metal oxides of a reactive compound composed of oxygen and of organometallic molecules, and comprises at least one of the elements Al, B, Ce, Co, Cr, Ge, Hf, In, Mn, Mo, Nb, Nd, Ni, Pb, Pr, Pt, Rb, Re, Rh, Ru, S, Sb, Sc, Si, Sm, Sn, Sr, Ta, Te, Ti, Tl, Tm, U, V, W, Yb, Zr, or Zn.

6. The component of claim 1, wherein the adhesion-promoter layer comprises a semiconductor oxide and/or metal oxide that is selected from the group consisting of $Al_2O_3$, $B_2O_3$, $Ce_2O_3$, $CoO$, $Co_2O_3$, $GeO_2$, $HfO_2$, $In_2O_3$, $Mn_2O_3$, $Mn_3O_4$, $MoO_2$, $Mo_2O_5$, $Nb_2O_3$, $NbO_2$, $Nd_2O_3$, $Ni_2O_3$, $NiO$, $PbO$, $Pr_2O_3$, $PrO_2$, $PtO$, $Pt_3O_4$, $Rb_2O$, $ReO_2$, $ReO_3$, $RhO_2$, $Rh_2O_3$, $RuO_2$, $SO_3$, $Sb_2O_4$, $Sb_4O_6$, $Sc_2O_3$, $SiO_2$, $Sm_2O_3$, $SnO$, $SnO_2$, $SrO$, $Te_2O_5$, $TeO_2$, $TeO_3$, $TiO$, $TiO_2$, $Ti_2O_3$, $Tl_2O_3$, $Tm_2O_3$, $UO_2$, $U_3O_8$, $UO_3$, $VO$, $V_2O_3$, $V_2O_4$, $V_2O_5$, $WO_2$, $WO_3$, $Yb_2O_3$, $ZrO_2$, $ZnO$, and mixtures thereof.

7. The component of claim 1, wherein the adhesion-promoter layer comprises silicate compounds.

8. A process for production of a semiconductor component, comprising:
provproviding a semiconductor chip having a first side and a second side, the second side having contact areas thereon;
mounting the first side of the semiconductor chip to a chip island;
electrically connecting the contact areas on the second side of the semiconductor chip to contacts of a flat conductor with bonding wires;
embedding the semiconductor chip, the chip island, the bonding wires, and an inner portion of the flat conductor in a thermoset material to form a semiconductor component casing;
applying a porous adhesion-promoter layer by pyrolytic deposition to an outer surface of the semiconductor component casing, wherein the adhesion-promoter layer includes semiconductor oxides and/or metal oxides;
embedding the semiconductor component casing in a thermoplastic casing retainer material, so that the adhesion-promoter layer has been arranged between the thermoset material and the thermoplastic material;
heating the thermoplastic material and the thermoset material to generate a bond between the thermoplastic material and the thermoset material such that a first portion of the adhesion-promoter layer covers the thermoset material with a pore-free fully compact morphology and the porosity of the adhesion-promoter layer gradually increases such that a second portion of the adhesion-promoter layer adjacent the thermoplastic material has microporous morphology;
wherein the application thickness D of the adhesion-promoter layer is in the range 5 nm≦D≦40 nm, and wherein the first portion of the adhesion-promoter layer is in the range of 5 to 10 nm of the adhesion-promoter layer.

9. The process of claim 8, wherein the adhesion-promoter layer is applied by means of flame pyrolysis.

10. The process of claim 8, wherein the adhesion-promoter layer applied by pyrolytic deposition, an organometallic compound of a semiconductor element or of a metal element, and an oxygen-containing compound, are introduced into a coating system using a ring burner, and semiconductor oxides or metal oxides are deposited on all sides, as reaction products of the input compounds, on free surfaces.

11. The process of claim 8, wherein prior to coating the surface with adhesion promoter, surface regions to be kept free are covered with a protective layer.

12. The process of claim 8, wherein after coating the surface with adhesion promoter, a protective layer is removed from the surface regions to be kept free.

13. The process of claim 8, wherein the semiconductor casing and the casing retainer are bonded to one another by an encapsulation process which takes place at temperatures above 260° C.

14. The process of claim 8, further comprising mounting the semiconductor component on a printed circuit board prior to embedding the semiconductor component casing in the thermoplastic material.

* * * * *